(12) United States Patent
Colli et al.

(10) Patent No.: US 9,905,720 B2
(45) Date of Patent: Feb. 27, 2018

(54) APPARATUS AND METHOD FOR SENSING

(71) Applicant: EMBERION OY, Espoo (FI)

(72) Inventors: Alan Colli, Cambridge (GB); Stefano Borini, Cambridge (GB)

(73) Assignee: EMBERION OY, Espoo (FI)

( * ) Notice: Subject to any disclaimer, the term of this patent is extended or adjusted under 35 U.S.C. 154(b) by 0 days.

(21) Appl. No.: 15/523,475

(22) PCT Filed: Oct. 22, 2015

(86) PCT No.: PCT/FI2015/050719
§ 371 (c)(1),
(2) Date: May 1, 2017

(87) PCT Pub. No.: WO2016/066891
PCT Pub. Date: May 6, 2016

(65) Prior Publication Data
US 2017/0309770 A1    Oct. 26, 2017

(30) Foreign Application Priority Data

Oct. 31, 2014  (EP) .................................. 14191383
Mar. 30, 2015  (EP) .................................. 15161553
Jun. 23, 2015  (EP) .................................. 15173329

(51) Int. Cl.
*G01N 27/403*     (2006.01)
*H01L 31/113*     (2006.01)
*H01L 31/119*     (2006.01)
*H01L 31/0352*    (2006.01)

(52) U.S. Cl.
CPC .... *H01L 31/113* (2013.01); *H01L 31/035218* (2013.01); *H01L 31/119* (2013.01)

(58) Field of Classification Search
None
See application file for complete search history.

(56) References Cited

U.S. PATENT DOCUMENTS

| 4,110,616 A | 8/1978 | Porter et al. |
| 4,608,865 A | 9/1986 | Muller et al. |
| (Continued) | | |

FOREIGN PATENT DOCUMENTS

| DE | 41 05 591 C1 | 4/1992 |
| GB | 2 021 761 A | 12/1979 |
| (Continued) | | |

OTHER PUBLICATIONS

European Search Report dated Mar. 1, 2016 corresponding to European Patent Application No. 15173329.2.

(Continued)

*Primary Examiner* — Telly Green
(74) *Attorney, Agent, or Firm* — Squire Patton Boggs (US) LLP

(57) ABSTRACT

An apparatus and method wherein the apparatus comprises: a sensing material configured to produce a non-random distribution of free charges in response to a parameter; an electric field sensor; a first conductive electrode comprising a first area overlapping the sensing material; an insulator provided between the first conductive electrode and the sensing material; a second electrode comprising a second area adjacent the electric field sensor; and a conductive interconnection between the first conductive electrode and the second conductive electrode.

8 Claims, 4 Drawing Sheets

(56) References Cited

U.S. PATENT DOCUMENTS

| | | | |
|---|---|---|---|
| 9,366,664 B2* | 6/2016 | Anglin, Jr. | G01N 33/497 |
| 9,453,811 B2* | 9/2016 | Duesberg | G01N 27/129 |
| 2009/0015491 A1 | 1/2009 | Ikeda et al. | |
| 2014/0151631 A1* | 6/2014 | Duesberg | G01N 27/129 257/9 |
| 2015/0338390 A1* | 11/2015 | Anglin, Jr. | G01N 33/497 73/23.3 |

FOREIGN PATENT DOCUMENTS

| | | |
|---|---|---|
| JP | 2599354 B2 | 4/1997 |
| JP | 3018174 B1 | 3/2000 |

OTHER PUBLICATIONS

International Search Report and Written Opinion dated Jan. 29, 2016 corresponding to International Patent Application No. PCT/FI2015/050719.

Alessandro Tredicucci et al., "Device Concepts for Graphene-Based Terahertz Photonics," IEEE Journal of Selected Topics in Quantum Electronics, IEEE, vol. 20, No. 1, Jan. 1, 2014, p. 8500109, XP011526240.

Zhenhua Sun et al.: "Infrared Photodetectors Based on CVD-Grown Graphene and PbS Quantum Dots with Ultrahigh Responsivity," Advanced Materials, vol. 24, No. 43, Nov. 14, 2012, pp. 5878-5883, XP55243035.

International Search Report & Written Opinion dated Feb. 17, 2016 corresponding to International Patent Application No. PCT/FI2015/050732.

European Search Report dated Oct. 7, 2015 corresponding to European Patent Application No. 15161553.1.

Cher Xuan Zhang et al., "Electrical Stress and Total Ionizing Dose Effects on Graphene-Based Non-Volatile Memory Devices," IEEE Transactions on Nuclear Science, vol. 59, No. 6, Dec. 2012, pp. 2974-2978, XP011487520.

International Search Report & Written Opinion dated Jan. 29, 2016 corresponding to International Patent Application No. PCT/FI2015/050709.

* cited by examiner

APPARATUS AND METHOD FOR SENSING

TECHNOLOGICAL FIELD

Examples of the disclosure relate to an apparatus and method for sensing. In particular, examples of the disclosure relate to an electrical apparatus and method of using such apparatus for sensing.

BACKGROUND

A sensing apparatus may be configured to sense an ambient parameter and produce an output. An electrical sensing apparatus produces an electrical output.

It is desirable to produce better sensing apparatus.

BRIEF SUMMARY

According to various, but not necessarily all, examples of the disclosure there may be provided an apparatus comprising: a sensing material configured to produce a non-random distribution of free charges in response to a parameter; an electric field sensor; a first conductive electrode comprising a first area overlapping the sensing material; an insulator provided between the first conductive electrode and the sensing material; a second electrode comprising a second area adjacent the electric field sensor; and a conductive interconnection between the first conductive electrode and the second conductive electrode.

In some examples the sensing material and the first conductive electrode may form a first capacitor having a first electrode dependent upon the distribution of free charges within the sensing material and wherein the first electric field causes, at the second conductive electrode, a second electric field that is dependent upon the first electric field amplified by a ratio of the first area to the second area.

In some examples the first area of the first conductive electrode may be larger than the second area of the second conductive electrode.

In some examples the first conductive electrode, the second conductive electrode and the conductive interconnection, in combination, may form an amplifying electrode.

In some examples the first conductive electrode, the second conductive electrode and the conductive interconnection, in combination, may form a doping electrode.

In some examples the electric field sensor may comprise graphene.

In some examples the electric field sensor may have a channel conductivity between a source and a drain that is dependent upon an electric field at the adjacent second conductive electrode.

In some examples the electric field sensor may comprise an insulated gate field effect transistor wherein the second conductive electrode provides an insulated gate.

In some examples the first conductive electrode, the second conductive electrode and the conductive interconnection, in combination, may be formed from a common material.

In some examples the sensing material may comprises quantum dots provided within a conductive material. The conductive material may comprise graphene.

According to various, but not necessarily all, examples of the disclosure there may be provided a sensing device comprising an apparatus as described above.

According to various, but not necessarily all, examples of the disclosure there may be provided a method comprising: providing a sensing material configured to produce a non-random distribution of free charges in response to a parameter; providing an electric field sensor; providing a first conductive electrode comprising a first area overlapping the sensing material; providing an insulator provided between the first conductive electrode and the sensing material; providing a second electrode comprising a second area adjacent the electric field sensor; and providing a conductive interconnection between the first conductive electrode and the second conductive electrode.

In some examples the sensing material and the first conductive electrode may form a first capacitor having a first electrode dependent upon the distribution of free charges within the sensing material and wherein the first electric field causes, at the second conductive electrode, a second electric field that is dependent upon the first electric field amplified by a ratio of the first area to the second area.

In some examples the first area of the first conductive electrode may be larger than the second area of the second conductive electrode.

In some examples the first conductive electrode, the second conductive electrode and the conductive interconnection, in combination, may form an amplifying electrode.

In some examples the first conductive electrode, the second conductive electrode and the conductive interconnection, in combination, may form a doping electrode.

In some examples the electric field sensor may comprise graphene.

In some examples the electric field sensor may have a channel conductivity between a source and a drain that is dependent upon an electric field at the adjacent second conductive electrode.

In some examples the electric field sensor may comprise an insulated gate field effect transistor wherein the second conductive electrode provides an insulated gate.

In some examples the first conductive electrode, the second conductive electrode and the conductive interconnection, in combination, may be formed from a common material.

In some examples the sensing material may comprise quantum dots provided within a conductive material. The conductive material may comprise graphene.

According to various, but not necessarily all, examples of the disclosure there may be provided examples as claimed in the appended claims.

BRIEF DESCRIPTION

For a better understanding of various examples that are useful for understanding the detailed description, reference will now be made by way of example only to the accompanying drawings in which.

DETAILED DESCRIPTION

Figure 1:
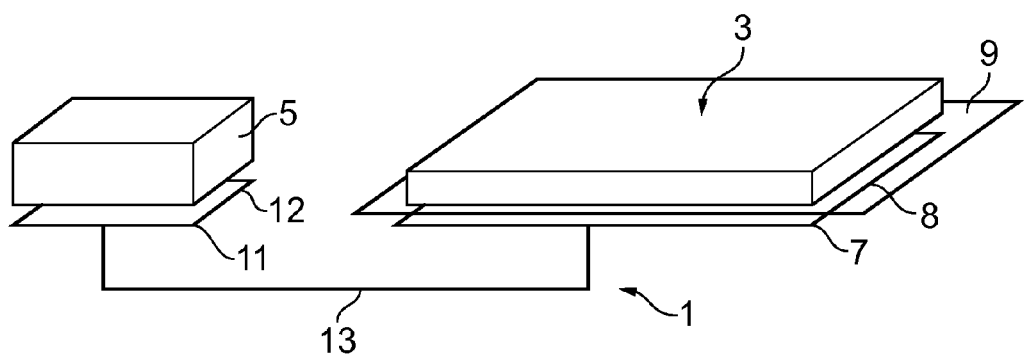
FIG. 1 illustrates an apparatus.

The Figures illustrate an apparatus 1 comprising: a sensing material 3 configured to produce a non-random distribution of free charges in response to a parameter; an electric field sensor 5; a first conductive electrode 7 comprising a first area 8 overlapping the sensing material 3; an insulator 9 provided between the first conductive electrode 7 and the sensing material 3; a second electrode 11 comprising a second area 12 adjacent the electric field sensor 5; and a conductive interconnection 13 between the first conductive electrode 7 and the second conductive electrode 11.

The apparatus 1 may be for sensing. The apparatus 1 may be for sensing an ambient parameter and producing an electrical output dependent on the ambient parameter.

FIG. 1 schematically illustrates an apparatus 1 according to examples of the disclosure. The apparatus 1 comprises a sensing material 3, an electric field sensor 5, a first conductive electrode 7, a second conductive electrode 11 and an insulator 9 provided between the first conductive electrode 7 and the sensing material 3.

The sensing material 3 may comprise any material which may be configured to sense an ambient parameter and provide an electrical response in dependence on the sensed parameter. The sensing material 3 may be configured such that the electrical field provided by free charges within the sensing material 3 is dependent on the ambient parameter.

An insulator 9 is provided between the sensing material 3 and the first conductive electrode 7. The insulator 9 may be positioned between the sensing material 3 and the first conductive electrode 7 so that there is no direct current path between the sensing material 3 and the first conductive electrode 7. The insulator 9 may be configured to prevent the sensing material 3 from coming into contact with the first conductive electrode 7.

The insulator 9 may cover the whole of the overlapping area between the sensing material 3 and the first conductive electrode 7. The insulator 9 may comprise a dielectric material, an ionic gel or any other suitable material.

The electric field sensor 5 is positioned adjacent to the second conductive electrode 11. The electric field sensor 5 may comprise any means which may be configured to detect the electric field provided by the second conductive electrode 11. The electric field sensor 5 may be configured to provide an electrical output. In some examples the electric field sensor 5 may comprise a channel which is positioned between a source and a drain. The channel may have a conductivity that is dependent upon the electric field at the adjacent second conductive electrode 11.

The channel of the electric field sensor 5 may comprise any material which has a resistance which may be tuned by the field effect. In some examples the channel may comprise a two dimensional material. In some examples the channel may comprise a monolayer of graphene or any other suitable material.

The first conductive electrode 7 has a first area 8 and the second conductive electrode 11 has a second area 12. The conductive interconnection 9 is provided between the first area 8 and the second area 12. The conductive electrodes 7, 11 are arranged so that the first area 8 is provided adjacent to the sensing material 3 and the second area 12 is provided adjacent to the electric field sensor 5.

The first conductive electrode 7 and the second conductive electrode 11 may comprise any conductive material such as metal, semiconductor, two dimensional material, ionic-liquid, ionic gel or any other suitable material. In some examples the first conductive electrode 7 and the second conductive electrode 11 may comprise graphene or indium tin oxide or any other suitable material. In some examples the first conductive electrode 7, the second conductive electrode 11 and the conductive interconnection 13 may be formed from a common material.

In some examples first conductive electrode 7 and/or the second conductive electrode 11 may be deformable. In some examples the first conductive electrode 7 and/or the second conductive electrode 11 may be transparent.

In some examples the first conductive electrode 7 and the second conductive electrode 11 may be formed as separate interconnected components. In other examples the electrodes 7, 11 may be formed as a single integral component, for example, as a patterned layer of the same material.

The first area 8 of the first conductive electrode 7 may be larger than the second area 12 of the second conductive electrode 11. The size difference of the first area 8 compared to the second area 12 may enable the apparatus 1 to amplify an electrostatic voltage at the first area 8 to a larger electrostatic voltage at the second area 12. The electrostatic voltage at the first area 8 is a result of a non-random distribution of free charges within the sensing material 3. As the insulator 9 prevents a direct current path between sensing material 3 and the first conductive electrode 7 the free charges within the sensing material 3 create an electrostatic voltage at the first area 8. The electrostatic voltage at the second area 12 is dependent upon the electrostatic voltage at the first area 8 amplified by a ratio of the first area 8 to the second area 12.

In some example apparatus the first conductive electrode 7, the second conductive electrode 11 and the conductive interconnection 13 may, in combination, form an amplifying electrode. The amplifying electrode may be configured to amplify the electrostatic voltage from the sensing material 3 to provide a larger electrostatic voltage to the electric field sensor 5.

In some example apparatus the first conductive electrode 7, the second conductive electrode 11 and the conductive interconnection 13 may, in combination, form a doping electrode. The doping electrode may be configured to use the electrostatic voltage from the sensing material 3 to control the electrostatic voltage provided at the second area 12. This may control the doping of a channel material within the electric field sensor 5.

In some examples the conductive electrodes 7, 11 may be electrically isolated or electrically isolatable. That is, the conductive electrodes 7, 11 may be permanently electrically isolated or switched to become electrically isolated. The isolation ensures that the conductive electrodes 7, 11 are a closed electrical circuit that conserves charge. There is no direct current path between the first conductive electrode 7 and the sensing material 3. There is also no direct current path between the second conductive electrode 11 and the electric field sensor 5.

Figure 2:
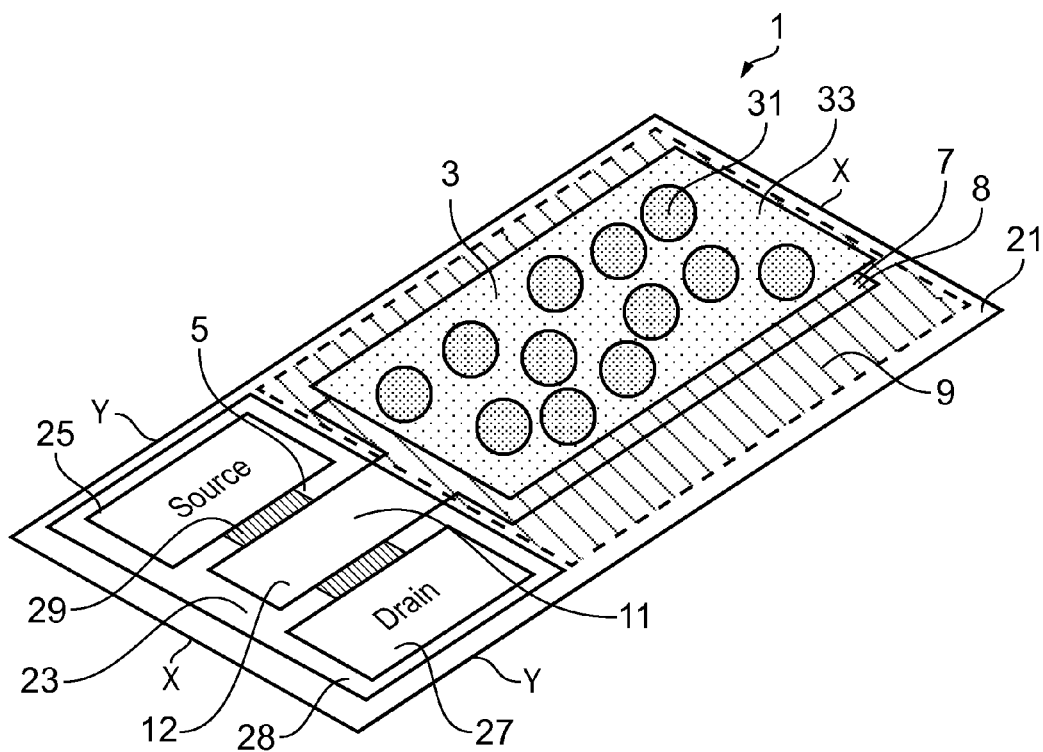
FIG. 2 illustrates a perspective view of an apparatus.
Figure 3A:
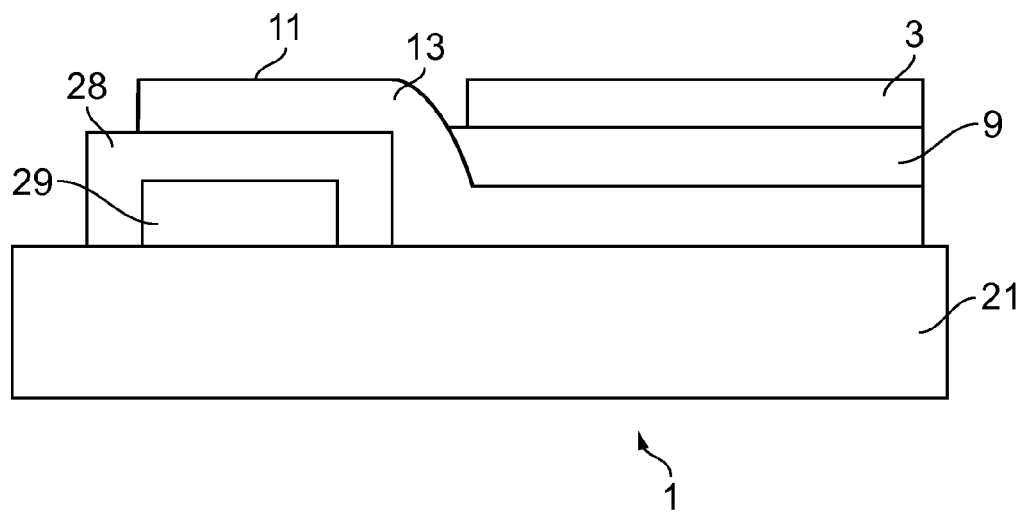
FIGS. 3A and 3B illustrate cross sections through the apparatus of FIG. 2.
Figure 3B:
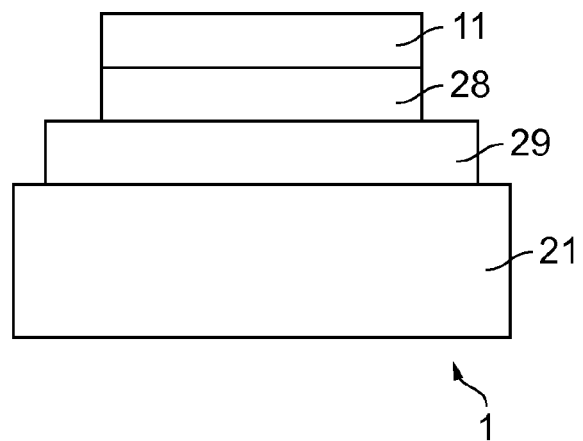

FIG. 2 illustrates a perspective view of an apparatus 1 according to examples of the disclosure. FIGS. 3A and 3B illustrate a cross section through the apparatus 1 of FIG. 2. FIG. 3A illustrates a cross section through the line X-X and FIG. 3B illustrates a cross section through the line Y-Y.

The apparatus 1 comprises sensing material 3, an electric field sensor 5, a first conductive electrode 7, a second conductive electrode 11 and an insulator 9 provided between the first conductive electrode 7 and the sensing material 3.

The apparatus 1 is provided on a substrate 21. In such examples apparatus 1 may comprise a material which may be grown on or deposited on the substrate 21. For example, the electric field sensor 5 or at least part of the electric field sensor 5 may be grown on the substrate 21.

In the example apparatus 1 the substrate 21 has no charge. The substrate 21 may be made of an insulating material.

In some examples the substrate 21 may be flexible or bendable. This may enable a flexible or bendable apparatus 1 to be provided. In such examples the substrate 21 may comprise any suitable flexible material such as a polymeric material.

In the example apparatus 1 the electric field sensor 5 comprises an insulated gate field effect transistor 23. The transistor 23 comprises a source 25 and a drain 27 and a channel 29 provided between the source 25 and the drain 27. The second conductive electrode 11 is provided overlapping at least a portion of the channel 29. An insulator 28 is provided between the channel 29 and the second conductive electrode 11 so that the second conductive electrode 11 provides an insulated gate. The insulator 28 may prevent electrical connection between the second conductive electrode 11 and the channel 29. The insulator 28 may comprise a dielectric material or any other suitable material.

In some examples the channel 29 may be formed on top of the substrate 21. In some examples the channel 29 may be formed of two dimensional material and the source 25 and drain 27 may be provided by a layer of graphene or any other suitable material. Conductive terminals may be applied to the source 25 and, separately, to the drain 27.

The sensing material 3 may be provided overlapping with the first conductive electrode 7.

The sensing material 3 may comprise any material which may be configured to detect an ambient parameter and produce a non-random distribution of free charges in response to the ambient parameter. The sensing material 3 may be arranged to respond to a physical parameter such as electromagnetic radiation, temperature, pressure, stress or any other suitable parameter. It is to be appreciated that the material which is used for the sensing material 3 may depend on the ambient parameter that the apparatus 1 is intended to detect.

In some examples the sensing material 3 may comprise free charges which may be non-randomly separated in response to the ambient parameter. This may create an electric field which can be sensed by the channel 29. In some examples when the ambient parameter is incident on the sensing material 3 this may cause the creation of an electron-hole pair. This may increase the number of charges within the sensing material 3. In such examples the sensing material 3 may also comprise a mechanism for separating the charges to produce an electric field.

In the example of FIG. 2 the sensing material 3 comprises quantum dots 31 provided within a conductive material 33. The quantum dots are not illustrated to scale in these figures.

The quantum dots 31 may comprise a nanocrystal which may be configured to produce a change in electric charge in response to a detected parameter. In some examples the quantum dots 31 may be configured to provide free charges in response to a detected ambient parameter.

The quantum dots 31 which are used may depend upon the parameter which is to be detected. In some examples the quantum dots 31 may be configured to sense incident electromagnetic radiation. The wavelength of the radiation which is detected may depend on the size of the quantum dots and/or the material used for the quantum dots. For example Graphite quantum dots or other suitable material may be used to detect infra red electromagnetic radiation. PbS quantum dots may be used to detect incident electromagnetic radiation such as X-rays or visible light.

In some examples the conductive material 33 may comprise a material with a high charge carrier mobility such as graphene or any other suitable material. The conductive material 33 may be arranged to have a band gap with the quantum dots 31 such that the electrons are transferred into the conductive material while the holes remain within the quantum dots 31. This creates a non-random distribution of free charges and produces an electric field.

It is to be appreciated that the use of quantum dots is an example and that other sensing materials 3 could be used in other examples of the disclosure.

The sensing material 3 may be provided in an area overlapping the first conductive electrode 7. In the example of FIG. 2 the sensing material 3 is provided overlaying the first conductive electrode 7. In some examples the area covered by the sensing material 3 may be the same as or substantially the same as, the first area 8 of the first conductive electrode 7.

An insulator 9 is provided between the sensing material 3 and the first conductive electrode 7. The insulator 9 may be provided as a thin layer between the sensing material 3 and the first conductive electrode 7.

In the example of FIG. 2 the insulator 9 extends beyond the area of the first conductive electrode 7 and the area of the sensing material 3. This may ensure that there is no direct path between the conductive electrode 7 and the sensing material 3.

The apparatus 1 may be configured to sense an ambient parameter and amplify the electrostatic voltage provided by the sensed parameter. The electrostatic voltage at the first area 8 of the conductive first electrode 7 is a dependent upon the size of the overlap between the first area 8 and the sensing material 3 and the electrostatic voltage provided by the sensing material 3.

The second area 12 of the second conductive electrode 11 is connected to the first area 8 by the conductive interconnect 13. This causes an electric field at the first 8 area to produce an electric field at the second area 12. The electric field at the second area 12 then produces a change in the conductivity of the channel 29.

Figure 4:
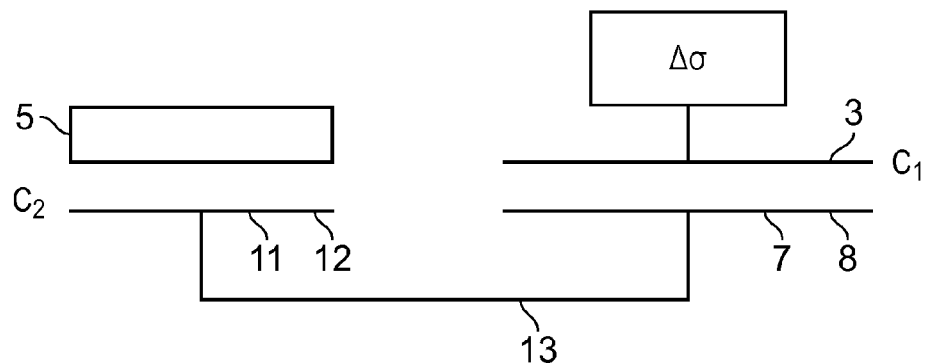
FIG. 4 illustrates an equivalent circuit diagram for an apparatus.

FIG. 4 illustrates an equivalent circuit diagram for the apparatus 1 of FIGS. 1 to 3B.

A change in the ambient parameter at the sensing material 3 causes a change $\Delta\sigma$ in the distribution of free charges within the sensing material 3. This causes a change in the local electric field around the sensing material 3.

The sensing material 3 and the first conductive electrode 7 form a first capacitor $C_1$. The first capacitor $C_1$ has an effective area $A_1$ corresponding to the first area 8 of the first conductive electrode 7. The first capacitor $C_1$ stores a charge $Q_1$ over the area $A_1$ and develops a voltage $V_1$.

The electric field sensor 5 and the second conductive electrode 11 may form a second capacitor $C_2$. The second capacitor $C_2$ has an effective area $A_2$ corresponding to the second area 12 of the second conductive electrode 11. The second capacitor $C_2$ stores a charge $Q_2$ over the area $A_2$ and develops a voltage $V_2$.

The sensing material 3 produces a fixed amount of charge per unit area, indicated as $\sigma(X)$. The amount of charge per unit area may provide be dependent upon a quantity of the parameter being sensed.

A first voltage $V_1$ generated at the first capacitor $C_1$ does not depend on the geometry of the first capacitor $C_1$. The first voltage $V_1$ is given by:

$$V_1 = \frac{Q_1}{C_1}$$

Where $Q_1=\sigma(X)*A_1$. Therefore if the area $A_1$ doubles, both $Q_1$ and $C_1$ double and $V_1$ stays constant.

As capacitors $C_1$ and $C_2$ are in series, $Q_2=Q_1$ must hold at all times. Therefore the second voltage $V_2$ at the second capacitor $C_2$ is given by:

$$V_2 = \frac{Q_2}{C_2} = \frac{Q_1}{C_2} = \frac{V_1 C_1}{C_2}$$

The second voltage $V_2$ scales with the capacitance ratio $C_1/C_2$. In order to provide an apparatus with gain it is desirable for $C_1$ to be larger than $C_2$. This may be achieved by making the first area $A_1$ larger than the second area $A_2$. In some examples the first area $A_1$ may be much larger than the second area $A_2$. In some examples the first area $A_1$ may be at least ten times larger than the second area $A_2$ and optionally at least fifty times larger than the second area $A_2$.

The sensing material 3 and the first conductive electrode 7 form a first capacitor $C_1$ having a first electric field dependent upon the charge distribution within the sensing material 3. The first electric field causes, at the second conductive electrode 11, a second electric field. The second electric field is dependent upon the first electric field amplified by a ratio of the first area 8 to the second area 12. The second electric field is detected by the electric field sensor 5 so that the electric field sensor 5 provides an output indicative of the sensed parameter.

Figure 5:
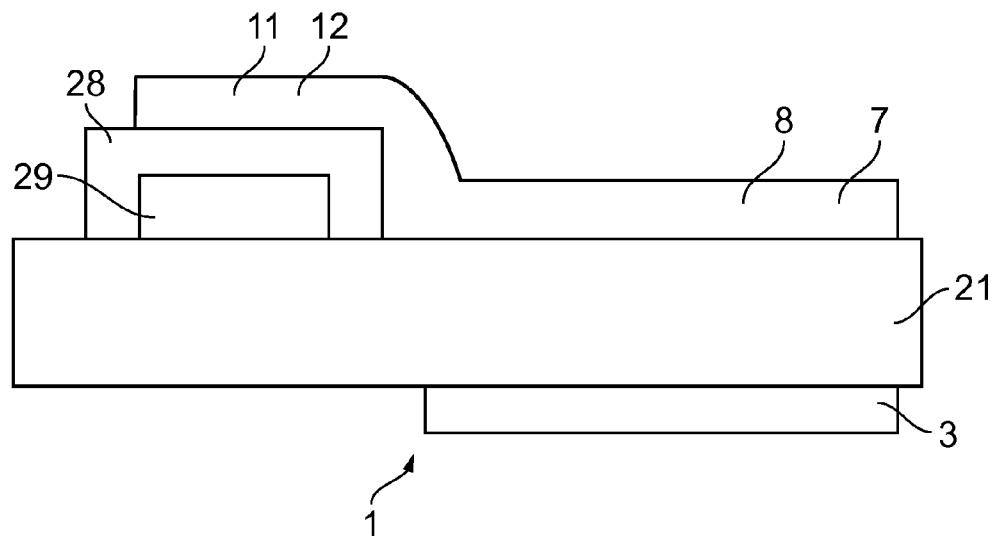
FIG. 5 illustrates a cross section through another apparatus.

FIG. 5 illustrates a cross section through another example apparatus 1. In the example apparatus 1 of FIGS. 2 to 3B the sensing material 3 is provided on the same side of a substrate 21 as the first electrode 7. In the example apparatus 1 of FIG. 5 the sensing material 3 is provided on the opposite side of the substrate 21 to the first electrode 7.

In the example apparatus 1 of FIG. 5 the substrate 21 may provide an insulator 9 between the sensing material 3 and the conductive electrode 7. The substrate 21 may be provided as a thin layer to ensure that the sensing material 3 is provided close to the first conductive electrode 7.

It is to be appreciated that other arrangements of the conductive electrodes 7, 11 and the sensing material 3 may be provided in other examples of the disclosure.

Figure 6:
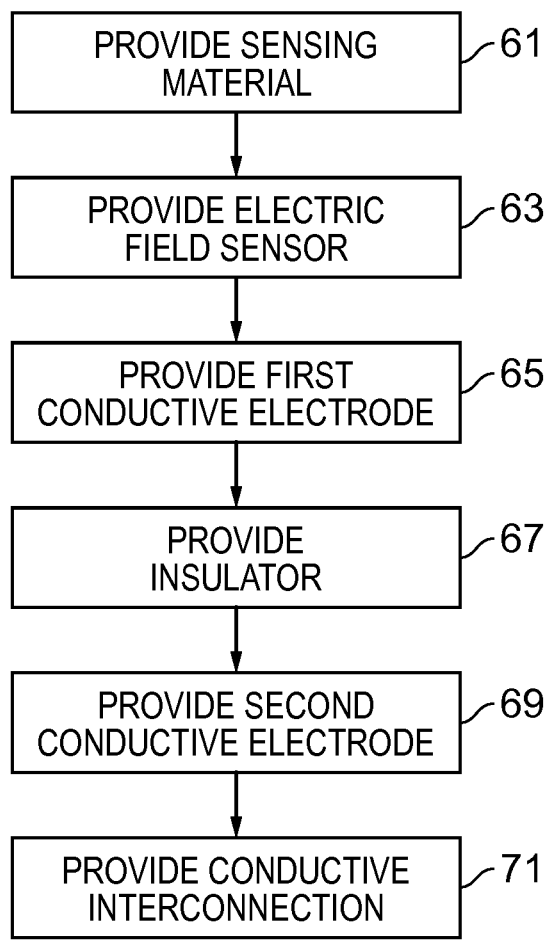
FIG. 6 illustrates a method according to examples of the disclosure.

FIG. 6 illustrates a method of providing an apparatus 1 according to examples of the disclosure. The method may be used to provide an apparatus 1 as described above. The method comprises providing, at block 61 a sensing material 3 configured to produce a non-random distribution of free charges in response to a parameter. The method also comprises, at block 63, providing an electric field sensor 5 and, at block 65, providing a first conductive electrode 7 comprising a first area 8 overlapping the sensing material 3. At block 67 the method comprises providing an insulator 9 between the first conductive electrode 7 and the sensing material 3. The method also comprises, at block 69, providing a second electrode 11 comprising a second area 12 adjacent the electric field sensor 5, and providing, at block 71 a conductive interconnection 9 between the first conductive electrode 7 and the second conductive electrode 11.

Examples of the disclosure provide for a sensing apparatus 1. The apparatus 1 allows for any material which produces an electrical response to a parameter to be used as sensing material 3. The example apparatus 1 also allows for a sensing material 3 which comprises free charges or which produces free charges in response to an ambient parameter to be used. This enables a similar apparatus 1 to be used with different types of materials to enable different ambient parameters to be sensed.

In the above examples the term coupled means operationally coupled. It is to be appreciated that any number or combination of intervening elements can exist including no intervening elements.

The term "comprise" is used in this document with an inclusive not an exclusive meaning. That is any reference to X comprising Y indicates that X may comprise only one Y or may comprise more than one Y. If it is intended to use "comprise" with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that includes some but not all of the instances in the class. It is therefore implicitly disclosed that a features described with reference to one example but not with reference to another example, can where possible be used in that other example but does not necessarily have to be used in that other example.

Although examples of the disclosure have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   a substrate,
   an electric field sensor on the substrate, wherein the electric field sensor comprises an insulated gate field effect transistor,
   a sensing material on the substrate, configured to produce a non-random distribution of free charges in response to a parameter;
   wherein
   a patterned layer of graphene comprises a first area which overlaps the sensing material;
   the patterned layer of graphene overlaps at least a portion of the channel in the insulated gate field effect transistor, and provides an insulated gate to the insulated gate field effect transistor, and that an insulator is provided between the patterned layer of graphene and the sensing material.

2. An apparatus as claimed in claim 1, wherein the first area of the patterned layer of graphene is larger than the area of the patterned layer of graphene which overlaps at least a portion of the channel in the insulated gate field effect transistor.

3. An apparatus as claimed in claim 1, wherein the channel in the electric field sensor comprises graphene.

4. An apparatus as claimed in claim 1, wherein the sensing material comprises quantum dots provided within a conductive material.

5. An apparatus as claimed in claim 4, wherein the conductive material comprises graphene.

6. An apparatus as claimed in claim 1, wherein the insulator comprises a dielectric material.

7. An apparatus as claimed in claim 1, wherein the insulator comprises an ionic gel.

8. An apparatus as claimed in claim 1, wherein the substrate is the insulator.

* * * * *